(12) United States Patent
Ordonez et al.

(10) Patent No.: US 6,498,751 B2
(45) Date of Patent: Dec. 24, 2002

(54) FAST SENSE AMPLIFIER FOR NONVOLATILE MEMORIES

(75) Inventors: Esther Vega Ordonez, München (DE); Thomas Kern, München (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 09/999,325

(22) Filed: Oct. 31, 2001

(65) Prior Publication Data
US 2002/0051386 A1 May 2, 2002

(30) Foreign Application Priority Data
Oct. 31, 2000 (DE) .......................... 100 53 956

(51) Int. Cl.[7] .............................. G11C 16/06
(52) U.S. Cl. .................... 365/185.21; 365/189.07; 365/205
(58) Field of Search .................. 365/185.21, 205, 365/189.07; 327/51

(56) References Cited

U.S. PATENT DOCUMENTS 6,122,212 A * 9/2000 Bui et al. ............. 365/185.21
6,392,447 B2 * 5/2002 Rai et al. ..................... 327/51

FOREIGN PATENT DOCUMENTS

JP  11 265 595 A  9/1999

* cited by examiner

Primary Examiner—Huan Hoang
(74) Attorney, Agent, or Firm—Laurence A. Greenberg; Werner H. Stemer; Gregory L. Mayback

(57) ABSTRACT

A sense amplifier for nonvolatile memories includes a first line path (precharging path) having a first transistor and a third transistor connected in series with the bit line for a memory cell that is to be read. The sense amplifier also includes a second line path (reading path), running parallel to the first line path, in which a transistor diode and a fourth transistor are connected in series with the bit line. The gates of the third transistor and of the fourth transistor are at the same potential, in particular, are connected to one another.

6 Claims, 3 Drawing Sheets

US 6,498,751 B2

FAST SENSE AMPLIFIER FOR NONVOLATILE MEMORIES

BACKGROUND OF THE INVENTION

FIELD OF THE INVENTION

The invention relates to a sense amplifier for nonvolatile memories. In particular, the invention relates to an application for such a sense amplifier in flash memory components, such as flash EEPROM (electrically erasable programmable ROMs) memory components.

Flash EEPROMs are understood to mean those EEPROM memory components that, while being electrically erasable, only ever allow the chip to be erased as a whole with its entire memory content. The name for such a memory component was derived from the fact that the memory can be electrically erased using a single erasing pulse that is normally a few seconds long ("flash").

Such flash memory components are also experiencing a trend toward progressive miniaturization, which has currently reached the lower submicron range (0.25 μm, 0.18 μm, 0.13 μm) for the characteristic feature sizes. However, the decreasing feature sizes conflict with the requirements of a reduced supply voltage and a reduced power consumption, and with the trend toward ever higher system clock frequencies. The most significant part of a nonvolatile memory component in such a respect is the sense amplifier, because it is very important to maintain a high read access speed and a low current consumption while, at the same time, the stability of the sense amplifier remains high.

In the sense amplifiers used to date, it has been necessary to make a compromise between current consumption and access time. A short access time is normally associated with a high current consumption, and vice-versa. Some applications require a very low current consumption, and, to achieve such an aim, read access has been divided into two phases (precharging and reading). FIG. 1 illustrates the sense amplification operation in a graph.

FIG. 2 is a schematic circuit diagram of a conventional sense amplifier circuit. The changeover between precharging and reading is effected by the signal PRE.

In a precharging phase (PRE=0), the bit line ($C_{BL}$) is charged by the transistor TP1 (p-conductive), which shorts the transistor TP2 (p-conductive) connected as a transistor diode. One side of the transistor TP1 is connected to a current source, and the other side of the transistor TP1 is connected through a transistor TN3 to the bit line for a memory cell that is to be read. The transistor TN3 (n-conductive) operates as a source follower to limit the bit line voltage. The total precharging current is provided by the transistor TP1 through the transistor TN3 until the bit line voltage reaches a maximum value of $V_{BL}=V_{BIAS}-V_{TN3}$, where $V_{BIAS}$ is a constant reference voltage and $V_{TN3}$ is the threshold voltage of the transistor TN3. To prevent DC power consumption, the cell transistor is off during the phase ($V_{CG}=0$)

FIG. 3 illustrates the characteristic curves for current (solid) and voltage (dashed) during the precharging phase. As the bit line capacitance $C_{BL}$ is charged, the voltage ($V_{BL}$) rises. At a relatively high bit line voltage, the voltage $V_{GS}$ (=$V_{REF}-V_{BL}$) on the transistor TN3 is reduced, the charging current falls and the bit line voltage tends toward its final value.

In a reading phase (PRE=1), after the bit line has been charged, the corresponding memory cell in the matrix is activated by the voltage $V_{CG}$. The transistor TP1 is turned off and, if the cell is on, a current is drawn through the transistor TN3 and the transistor diode TP2. A point between the transistor diode TP2 and the transistor TN3 is connected to the + input of a current comparator. The transistor diode TP2 mirrors the cell current into the current comparator, which compares $I_{CELL}$ ($V_{CELL}$) with a reference current signal ($V_{REF}$) If the cell is off, no current flows ($I_{CELL}=0$ μA). The value of the reference current is chosen such that a maximum signal-to-noise ratio is obtained for the value of $I_{CELL}$ and 0 μA.

The total access time is determined by the charging current in the precharging phase and the direct current of the memory cell, which is in the range from 10 μA to 20 μA with a tendency to decrease further. The reference current is, therefore, in the range from 5 μA to 10 μA. The changeover from the precharging phase to the reading phase is determined by the decrease in the charging current. If precharging is stopped prematurely (TP1 off), the remaining charge needs to be provided by the transistor diode TP2. The current is likewise compared with the reference current. If the memory cell is off (direct current is 0 μA) and the charging current is above the reference current, the cell that is off is mistakenly detected to be a cell that is on.

As shown in FIG. 3 ($C_{BL}$=1 pF), the precharging time is very long at $t_{PRE}$~50 ns when the charging current reaches values of 1 μA. Despite the fact that the bit line voltage rises only negligibly (~50 mV), the charging time needs to be extended to ensure an adequate safety margin from the reference current (the precharging current must fall below 1 μA).

SUMMARY OF THE INVENTION

It is accordingly an object of the invention to provide a fast sense amplifier for nonvolatile memories that overcomes the hereinafore-mentioned disadvantages of the heretofore-known devices of this general type and that provides a sense amplifier with reduced access time.

With the foregoing and other objects in view, there is provided, in accordance with the invention, a sense amplifier for nonvolatile memories, in particular, a flash EEPROM memory, having memory cells and bit lines, including first through fourth transistors, a current comparator having a comparator input, a first line path in which the first transistor is connected in series to the third transistor and the bit line for the memory cell to be read, a second line path, running parallel to the first line path, in which the second transistor, being a transistor diode, is connected in series to the fourth transistor and the bit line, the second transistor and the fourth transistor having a crossover point connected to the comparator input, the first transistor to be controlled by a switching signal having an off switching position in which the first transistor allows the bit line to be precharged by the third transistor, and the gate of the third transistor and the gate of the fourth transistor being at a same potential.

A fundamental concept of the invention is that of isolating the precharging path and the reading path in the electric circuit of a sense amplifier from one another completely by adding a further transistor. In such a context, a sense amplifier for nonvolatile memories has a first line path (precharging path) including a first transistor and a third transistor that are connected in series with the bit line for a memory cell that is to be read. The sense amplifier also has a second line path (reading path), running parallel to the first line path, in which a transistor diode and a fourth transistor are connected in series with the bit line. The gates of the third transistor and of the fourth transistor are at the same potential, in particular, are connected to one another.

In accordance with another feature of the invention, the gate of the third transistor and the gate of the fourth transistor are connected to one another to have a same potential.

In accordance with a further feature of the invention, the current comparator has a negative input connected to a reference signal.

In accordance with an added feature of the invention, the third transistor has a threshold voltage and the fourth transistor has a threshold voltage higher than the threshold voltage of the third transistor.

In accordance with an additional feature of the invention, the third transistor has a W/L ratio, where W is a gate width and L is a gate length, and the fourth transistor has a W/L ratio lower than the a W/L ratio of the third transistor.

With the objects of the invention in view, there is also provided a nonvolatile memory, in particular, a flash EEPROM memory, integrated on a common chip with a sense amplifier including first through fourth transistors, a current comparator having a comparator input, a first line path in which the first transistor is connected in series to the third transistor and the bit line for the memory cell to be read, a second line path, running parallel to the first line path, in which the second transistor, being a transistor diode, is connected in series to the fourth transistor and the bit line, the second transistor and the fourth transistor having a crossover point connected to the comparator input, the first transistor to be controlled by a switching signal having an off switching position in which the first transistor allows the bit line to be precharged by the third transistor, and the gate of the third transistor and the gate of the fourth transistor being at a same potential.

Other features that are considered as characteristic for the invention are set forth in the appended claims.

Although the invention is illustrated and described herein as embodied in a fast sense amplifier for nonvolatile memories, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

DESCRIPTION OF THE PREFERRED EMBODIMENTS

One aim of the invention is to minimize the precharging time without adversely affecting the signal-to-noise ratio band in so doing.

Figure 1:
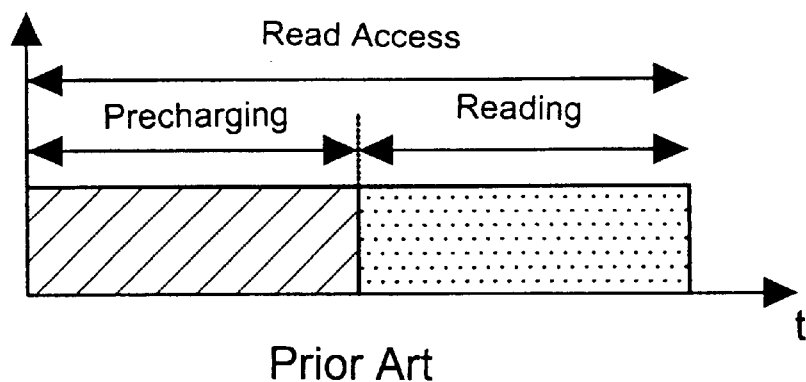
FIG. 1 is a graph illustrating conventional read access time, divided into the precharging phase and the reading phase.
Figure 2:
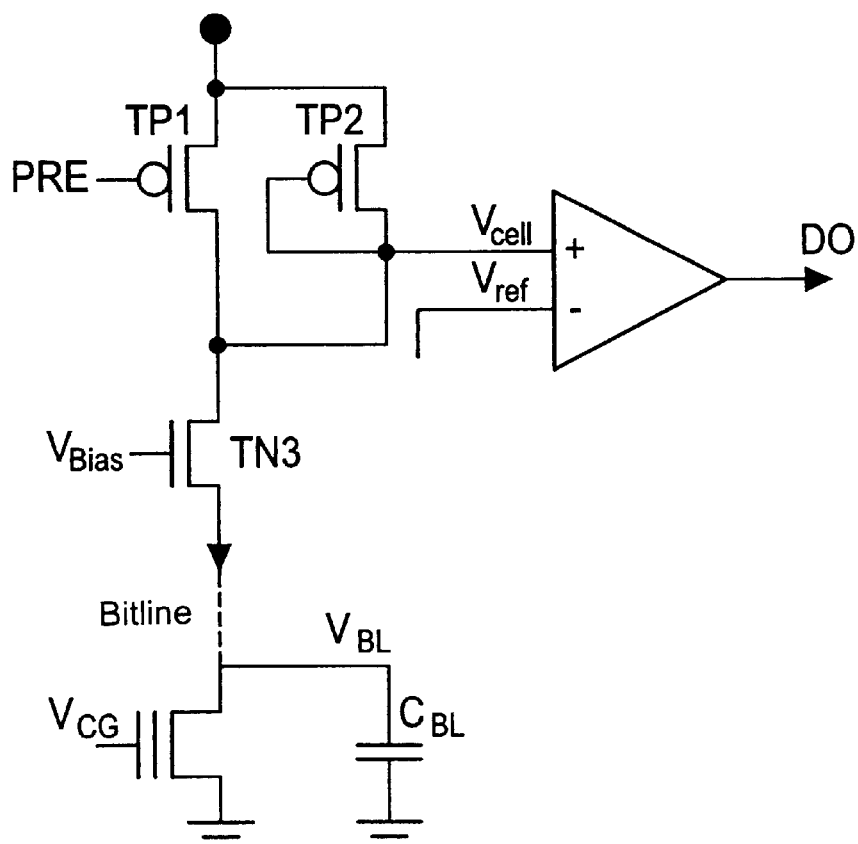
FIG. 2 is a schematic circuit diagram of a prior art sense amplifier.
Figure 3:
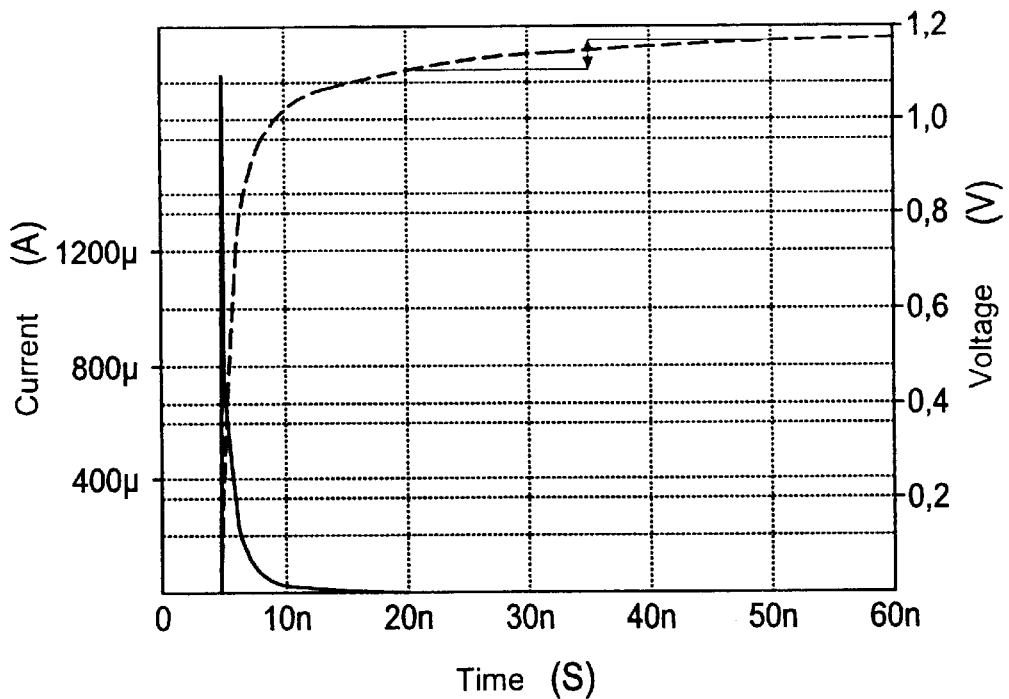
FIG. 3 is a combination graph illustrating current and voltage curves for the sense amplifier of FIG. 2 during a precharging phase.
Figure 4:
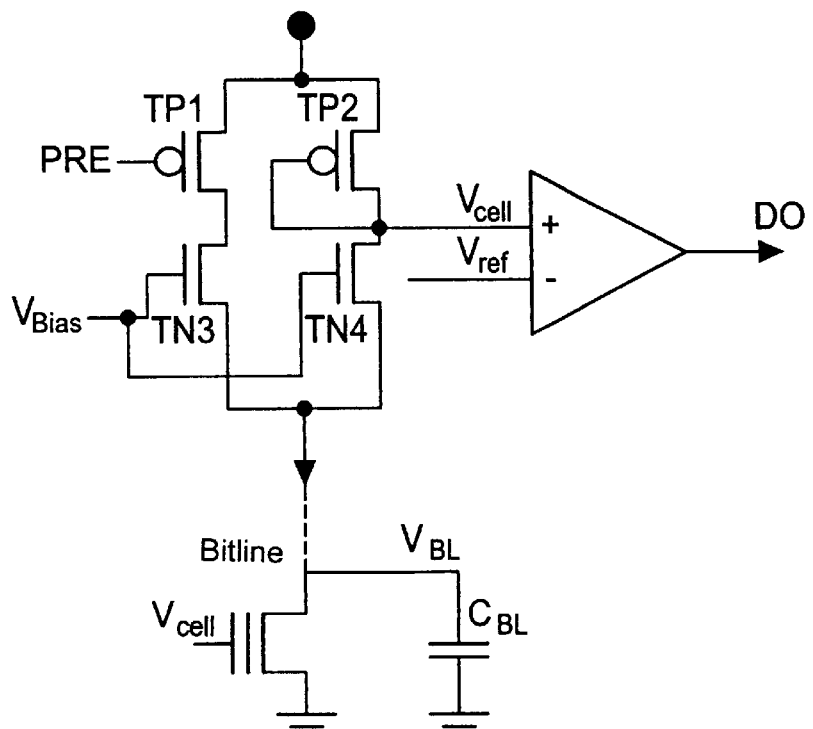
FIG. 4 is a schematic circuit diagram of a sense amplifier according to the invention.

Referring now to the figures of the drawings in detail and first, particularly to FIG. 4 thereof, there is shown a sense amplifier achieving such a minimization without the adverse affect.

The basic idea of the invention is to isolate the precharging path and the reading path in the electric circuit from one another completely by adding a further transistor TN4 (n-conductive). The further transistor TN4 is, thus, connected in series with the transistor TP2 in the second line path (reading path) and is connected to the bit line. In parallel therewith, the transistors TP1 and TN3 are connected in series in the first line path (precharging path) and are connected to the bit line. The transistor TP1 is connected to a current source. A point between the transistor TP2 and the transistor TN4 is connected to the positive input of a current comparator. The negative input of the current comparator has a reference signal $V_{ref}$ supplied thereto. The gate electrodes of the transistors TN3 and TN4 are connected to one another, and a voltage $V_{BIAS}$ is supplied to them.

The transistor TN4 has a higher threshold voltage and a lower W/L ratio (W=gate width, L=gate length) than the transistor TN3. The result of such a difference in the threshold voltage $V_T$ is that, in the final phase of charging, the current is provided only by the transistor TN3, and the transistor TN4 is already in the off state. Such a condition translates into a process where the precharging phase can be terminated significantly earlier, namely, when the transistor TN4 is transferred to the sub-threshold voltage range.

To speed up the process of transfer to the sub-threshold voltage range, the transistor TN4 may, by way of example, have a lower W/L ratio than the transistor TN3. Such a condition occurs because the threshold voltage difference can be produced by using standard logic components and utilizing the short-channel effects thereof. In the case of transistors with critical feature sizes in the lower submicron range, shortening the channel length results in a higher threshold voltage (increase in $V_T$ as L decreases). In comparison, the relationship is the reverse for technologies with relatively great feature sizes.

Figure 5:
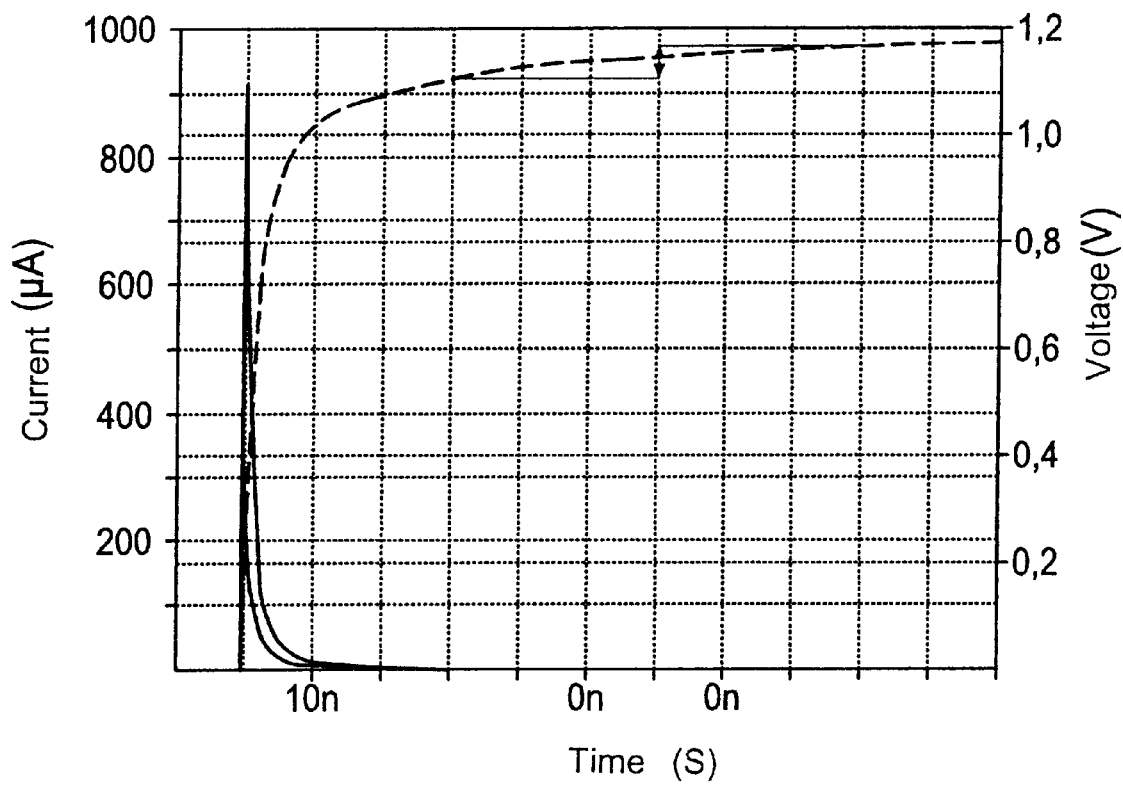
FIG. 5 is a combination graph illustrating current and voltage curves for the sense amplifier of FIG. 4 during the precharging phase.

FIG. 5 illustrates the transistor currents for TN3 and TN4 during precharging ($C_{BL}$=1 pF). TN4 reaches values below 1 $\mu$A at a time of only 10 ns after precharging started. Such a condition translates into a reduction of the precharging time by a factor of five.

The reading time for "ones" is adversely affected by virtue of the bit line voltage needing to be reduced by an additional amount ($\Delta V_T$ between TN3 and TN4 is typically ~50 mV). Taking into account the bit line capacitance and the cell current, the additional time is given by:

$$\Delta t = \Delta Q/I_{cell} = \Delta V_T C_{BL}/I_{cell}$$

When $\Delta V_T$=50 mV, $C_{BL}$=1 pF, and $I_{cell}$=10 $\mu$A, the additional time $\Delta t$ obtained is 5 ns and the reading time is extended from 15 ns to 20 ns. The significant saving of 40 ns during precharging translates into a total access time in the region of 30 ns, which is less than half the time that was required previously. Isolating the precharging path from the reading path in the electric circuit likewise contributes to the precharging operation because the PMOS transistor diode TP2 is no longer shorted by the PMOS switch TP1. Such a condition likewise helps to speed up precharging.

In one advantageous embodiment, the sense amplifier of the invention can be integrated with the nonvolatile memory, in particular, a flash EEPROM, on a common chip.

We claim:

1. A sense amplifier for nonvolatile memories having memory cells and bit lines, comprising:

a first transistor;

a second transistor;

a third transistor having a gate, a threshold voltage, and a W/L ratio, where W is a gate width and L is a gate length;

a fourth transistor having a gate, a threshold voltage higher than said threshold voltage of said third transistor, and a W/L ratio lower than said W/L ratio of said third transistor;

a current comparator having a comparator input;

a first line path in which said first transistor is connected in series to said third transistor and the bit line for the memory cell to be read;

a second line path, running parallel to said first line path, in which said second transistor, being a transistor diode, is connected in series to said fourth transistor and the bit line;

said second transistor and said fourth transistor having a crossover point connected to said comparator input;

said first transistor to be controlled by a switching signal having an off switching position in which said first transistor allows the bit line to be precharged by said third transistor; and said gate of said third transistor and said gate of said fourth transistor being at a same potential.

2. The sense amplifier according to claim 1, wherein said gate of said third transistor and said gate of said fourth transistor are connected to one another to have a same potential.

3. The sense amplifier according to claim 1, wherein said current comparator has a negative input connected to a reference signal.

4. A sense amplifier for a flash EEPROM memory having memory cells and bit lines, comprising:

a first transistor;

a second transistor;

a third transistor having a gate, a threshold voltage, and a W/L ratio, where W is a gate width and L is a gate length;

a fourth transistor having a gate, a threshold voltage higher than said threshold voltage of said third transistor, and a W/L ratio lower than said W/L ratio of said third transistor;

a current comparator having a comparator input;

a first line path in which said first transistor is connected in series to said third transistor and the bit line for the memory cell to be read;

a second line path, running parallel to said first line path, in which said second transistor, being a transistor diode, is connected in series to said fourth transistor and the bit line;

said second transistor and said fourth transistor having a crossover point connected to said comparator input;

said first transistor to be controlled by a switching signal having an off switching position in which said first transistor allows the bit line to be precharged by said third transistor; and said gate of said third transistor and said gate of said fourth transistor being at a same potential.

5. In a nonvolatile memory integrated on a common chip with a sense amplifier, the nonvolatile memory having memory cells and bit lines, the sense amplifier comprising:

a first transistor;

a second transistor;

a third transistor having a gate, a threshold voltage, and a W/L ratio, where W is a gate width and L is a gate length;

a fourth transistor having a gate, a threshold voltage higher than said threshold voltage of said third transistor, and a W/L ratio lower than said W/L ratio of said third transistor;

a current comparator having a comparator input;

a first line path in which said first transistor is connected in series to said third transistor and the bit line for the memory cell to be read;

a second line path, running parallel to said first line path, in which said second transistor, being a transistor diode, is connected in series to said fourth transistor and the bit line;

said second transistor and said fourth transistor having a crossover point connected to said comparator input;

said first transistor to be controlled by a switching signal having an off switching position in which said first transistor allows the bit line to be precharged by said third transistor; and said gate of said third transistor and said gate of said fourth transistor being at a same potential.

6. In a flash EEPROM memory integrated on a common chip with a sense amplifier, the flash EEPROM memory having memory cells and bit lines, the sense amplifier comprising:

a first transistor;

a second transistor;

a third transistor having a gate, a threshold voltage, and a W/L ratio, where W is a gate width and L is a gate length;

a fourth transistor having a gate, a threshold voltage higher than said threshold voltage of said third transistor, and a W/L ratio lower than said W/L ratio of said third transistor;

a current comparator having a comparator input;

a first line path in which said first transistor is connected in series to said third transistor and the bit line for the memory cell to be read;

a second line path, running parallel to said first line path, in which said second transistor, being a transistor diode, is connected in series to said fourth transistor and the bit line;

said second transistor and said fourth transistor having a crossover point connected to said comparator input;

said first transistor to be controlled by a switching signal having an off switching position in which said first transistor allows the bit line to be precharged by said third transistor; and said gate of said third transistor and said gate of said fourth transistor being at a same potential.

\* \* \* \* \*